(12) United States Patent
Ito

(10) Patent No.: US 7,868,715 B2
(45) Date of Patent: Jan. 11, 2011

(54) DUPLEXER AND COMMUNICATION APPARATUS USING THE SAME

(75) Inventor: Motoki Ito, Kyoto (JP)

(73) Assignee: Kyocera Corporation, Kyoto (JP)

( * ) Notice: Subject to any disclaimer, the term of this patent is extended or adjusted under 35 U.S.C. 154(b) by 299 days.

(21) Appl. No.: 12/091,428

(22) PCT Filed: Oct. 26, 2006

(86) PCT No.: PCT/JP2006/321377

§ 371 (c)(1),
(2), (4) Date: Apr. 24, 2008

(87) PCT Pub. No.: WO2007/049699

PCT Pub. Date: May 3, 2007

(65) Prior Publication Data

US 2009/0289741 A1 Nov. 26, 2009

(30) Foreign Application Priority Data

Oct. 27, 2005 (JP) ............... 2005-312706

(51) Int. Cl.
*H03H 9/72* (2006.01)
*H03H 9/64* (2006.01)

(52) U.S. Cl. ....................... 333/133; 333/195
(58) Field of Classification Search ............... 333/133, 333/193, 195, 132; 310/313 R
See application file for complete search history.

(56) References Cited

U.S. PATENT DOCUMENTS

| 6,903,630 | B2 | 6/2005 | Miura et al. |
| 6,975,185 | B2 | 12/2005 | Tsutsumi et al. |
| 7,180,388 | B2 | 2/2007 | Matsuda et al. |
| 7,202,590 | B2 | 4/2007 | Matsuda et al. |
| 7,227,429 | B2 | 6/2007 | Kawachi et al. |
| 7,400,216 | B2 | 7/2008 | Fuse |

(Continued)

FOREIGN PATENT DOCUMENTS

JP      05-167388      7/1993

(Continued)

OTHER PUBLICATIONS

Chinese language office action and its English language translation for corresponding Chinese application 2006800396638 lists the references above, Dec. 11, 2009.

(Continued)

*Primary Examiner*—Benny Lee
*Assistant Examiner*—Alan Wong
(74) *Attorney, Agent, or Firm*—DLA Piper LLP (US)

(57) ABSTRACT

The present invention provides a duplexer using a ladder-type filter, which has a small size and is superior in isolation characteristic, and a communication apparatus using such a duplexer. A series resonator (R1) contained in a first filter element (F1) and a parallel resonator (R4) contained in a second filter element (F2) are disposed so as not to allow the elastic wave propagating paths to be overlapped with each other. By disposing them in this manner, it is possible to prevent an elastic wave, leaked from the series resonator (R1) and most influential to the isolation characteristic, from being received by the parallel resonator (R4). Consequently, it is possible to achieve a small-size duplexer that is superior in isolation characteristic.

6 Claims, 8 Drawing Sheets

U.S. PATENT DOCUMENTS

| | | |
|---|---|---|
| 2003/0214372 A1 | 11/2003 | Miura et al. |
| 2004/0095206 A1 | 5/2004 | Tsutsumi et al. |
| 2004/0207485 A1 | 10/2004 | Kawachi et al. |
| 2004/0222717 A1 | 11/2004 | Matsuda et al. ............. 310/313 |
| 2005/0156687 A1 | 7/2005 | Matsuda et al. |
| 2006/0197630 A1 | 9/2006 | Fuse .......................... 333/133 |

FOREIGN PATENT DOCUMENTS

| | | |
|---|---|---|
| JP | 2002-176335 | 6/2002 |
| JP | 2004-048240 | 2/2004 |
| JP | 2004-336503 | 11/2004 |
| KR | 1020040096780 A | 11/2004 |
| WO | WO 2005/011114 A1 | 2/2005 |

OTHER PUBLICATIONS

European search report for corresponding European application 06822353.6 lists the references above, Aug. 21, 2009.
Japanese language office action and its English language translation for corresponding Japanese application 2007542656.

DUPLEXER AND COMMUNICATION APPARATUS USING THE SAME

CROSS-REFERENCE TO THE RELATED APPLICATIONS

This application is a national stage of international application No. PCT/JP2006/321377 filed on Oct. 26, 2006, which also claims benefit of priority under 35 U.S.C. §119 to Japanese Patent Application No. 2005-312706 filed on Oct. 27, 2005, the entire contents of which are incorporated herein by reference.

TECHNICAL FIELD

The present invention relates to a duplexer formed by elastic surface wave elements, and a communication apparatus using such a filter.

BACKGROUND ART

In recent years, along with the developments of multifunctional portable communication terminals with multiple bands, the number of parts constituting a so-called RF front-end portion also increases; however, since there have been demands for a small size and light weight in the portable communication terminal in its own structure, there have been further demands for a small size and light weight in the respective parts in comparison with conventional parts.

Among the respective parts of the portable communication terminal, there is a duplexer which is used right below the antenna. The duplexer refers to a device having a function for separating signals having different frequency bands, and, for example, a duplexer for separating a transmission frequency band and a receiving frequency band from each other is used in a portable communication terminal or the like of a CDMA system.

Conventionally, a duplexer which uses a dielectric resonator filter has been used; however, in recent years, because of demands for small sizes, a duplexer which uses an elastic surface wave filter has been used. The elastic surface wave filter is an element which uses elastic surface waves that are excited by an IDT (Inter Digital Transducer) placed on a piezoelectric substrate (for example, see JP-A No. 05-167388).

The duplexer is constructed by connecting a plurality of filter devices having different frequency pass bands with one another. FIG. 2 is a drawing that schematically shows a circuit structure of a duplexer D1 as a general example. In the duplexer D1, a first filter F1 and a second filter F2 are connected by a common electrode 4000, and an antenna terminal 1000 is connected to the common electrode 4000. For example, when the first filter F1 serves as a filter (hereinafter, referred to as Tx filter) that allows the transmission frequency band to pass while the second filter F2 serves as a filter (hereinafter, referred to as Rx filter) that allows the receiving frequency band to pass, a signal received by the antenna terminal 1000 is sent to a receiving circuit, not shown, from an output terminal 2000 through the second filter F2 (Rx filter), and a signal from the transmission circuit, not shown, is sent from the input terminal 2000 through the first filter F1 (Tx filter) to the antenna terminal 1000 from which it is transmitted.

In a circuit structure shown in FIG. 2, however, for example, the transmission signal is not only sent from the common electrode 4000 to the antenna terminal 1000, but also leaked toward the receiving circuit side. Therefore, a matching circuit L1 is disposed between the antenna terminal 1000 and the respective filters F1, F2. The matching circuit L1 functions so that the transmission circuit is allowed to have a virtually infinite impedance in the receiving frequency band for the antenna terminal 1000, and so that the receiving circuit is allowed to have a virtually infinite impedance in the transmitting frequency band for the transmission circuit. Here, the numeric value indicating a degree of a signal leaking from the transmission circuit to the receiving circuit is generally referred to as an isolation characteristic, which indicates that the greater the value, the smaller the leakage.

The duplexer is required to have a high isolation characteristic in the transmission band as well as in the receiving band. In the conventional duplexer, in order to achieve a small size, the respective resonators are normally placed closely to each other. However, in such a structure, a signal is leaked between the Tx filter and the Rx filter, failing to avoid degradation in the isolation characteristic.

With respect to this problem, JP-A No. 2004-48240 has disclosed a structure in which, in a DMS-type filter, a plurality of pairs of comb-shaped electrodes are disposed in such a manner that main propagating directions of the respective elastic waves are not overlapped with each other; thus, the Patent Document describes that it becomes possible to avoid propagating waves between the electrodes from interfering with each other, and consequently to reduce spurious characteristics (for example, see claim 11, FIG. 2, etc.).

Since the DMS-type filter generally has few resonators, it is comparatively easy to dispose the comb-shaped electrodes so that main propagating directions of the respective elastic waves are not overlapped with each other, as described above. However, in the case of the duplexer that requires a power resistant property, a ladder-type filter rather than a DMS-type filter tends to be used. Here, the ladder-type filter has many resonators; therefore, when an attempt is made to apply the technique disclosed by JP-A No. 2004-48240 to the ladder-type filter so that the comb-shaped electrodes are mutually disposed, with propagating paths of the respective elastic waves being deviated from each other, a problem arises in which it becomes difficult to achieve a small size.

SUMMARY OF THE INVENTION

The inventors of the present invention have found that, with respect to the isolation characteristic of a duplexer using a ladder-type filter, even when resonators, which respectively form a Tx filter having a pass band on a low frequency side and a Rx filter having a pass band on a high frequency side, have overlapped portions in their extending lines of elastic wave propagating paths, there are some structures that are less vulnerable to degradation in the isolation characteristic. Based upon these findings, they have further studied, and found that, when an elastic wave, leaked from a resonator (referred to also as "series resonator") that is disposed on a series arm, and serves as a resonator for controlling the characteristics on the high pass band side of a filter element having a pass band on a low frequency side, is received by a resonator (referred to also as "parallel resonator") that is disposed on parallel arms, and serves as a resonator for controlling the characteristics on the low pass band side of a filter element having a pass band on a high frequency side, the isolation characteristic deteriorates most seriously. Based upon these findings, they have further made trials and evaluations, and have achieved the structure of the present invention described below.

The present invention has been devised to solve the above-mentioned problems, and its objective is to provide a duplexer that uses a latter-type filter having a superior power resistant characteristic and has a small size with a superior isolation characteristic, and a communication apparatus using such a filter.

In order to achieve the above-mentioned objective, a duplexer in accordance with a first aspect is provided with a first filter element and a second filter element having a frequency pass band higher than that of the first filter element, which are placed on a piezoelectric substrate, wherein each of the first and second filter elements has a ladder-type structure in which a plurality of resonators having comb-shaped electrode fingers is disposed on a series arm and one or a plurality of parallel arms, the first and second filter elements are placed on the piezoelectric substrate so as be made face to face with each other, all the plurality of resonators of the first and second filter elements are arranged so as to have the longitudinal direction thereof along a propagating direction of an elastic surface wave of the piezoelectric substrate, and at least one of the one or the plurality of resonators placed on one or the plurality of parallel arms of the second filter element is disposed at a position that deviates from elastic wave propagating paths of all the resonators placed on the series arm of the first filter element on the piezoelectric substrate.

In accordance with the first aspect, an elastic wave that leaks from the series resonators that are resonators used for controlling the characteristic of the first filter element on the high pass band side is prevented from being received by one or a plurality of parallel resonators used for controlling the characteristic of the second filter element on the low pass band side. Thus, it becomes possible to achieve a duplexer that is superior in isolation characteristic.

A duplexer in accordance with a second aspect is provided with a first filter element and a second filter element having a frequency pass band higher than that of the first filter element, which are placed on a piezoelectric substrate, wherein each of the first and second filter elements has a ladder-type structure in which a plurality of resonators having comb-shaped electrode fingers is disposed on a series arm and one or a plurality of parallel arms, the first and second filter elements are placed on the piezoelectric substrate so as be made face to face with each other, all the plurality of resonators of the first and second filter elements are arranged so as to have the longitudinal direction thereof along a propagating direction of an elastic surface wave of the piezoelectric substrate, and the one or the plurality of resonators placed on the one or the plurality of parallel arms of the second filter element is disposed at a position that deviates from an elastic wave propagating path of the resonator having the largest width in the elastic wave propagating path among the resonators placed on the series arm of the first filter element on the piezoelectric substrate.

In accordance with the second aspect, an elastic wave that leaks from the resonator having the largest width in the elastic wave propagating path among the series resonators used for controlling the characteristic of the first filter element on the high pass band side is effectively prevented from being received by one or a plurality of parallel resonators used for controlling the characteristic of the second filter element on the low pass band side. Thus, it becomes possible to achieve a duplexer that is superior in isolation characteristic.

A duplexer in accordance with a third aspect, which relates to the duplexer of the second aspect, has a structure in which the one or the plurality of resonators placed on the one or the plurality of parallel arms of the second filter element is disposed at a position that deviates from elastic wave propagating paths of all the resonators placed on the series arm of the first filter element on the piezoelectric substrate.

In accordance with the third aspect, an elastic wave that leaks from the series resonators that are resonators used for controlling the characteristic of the first filter element on the high pass band side is restrained from being received by one or a plurality of parallel resonators used for controlling the characteristic of the second filter element on the low pass band side to a level that causes no problems in practical use. Thus, it becomes possible to achieve a duplexer that is superior in isolation characteristic.

A duplexer in accordance with a fourth aspect is provided with a first filter element and a second filter element having a frequency pass band higher than that of the first filter element, which are placed on a piezoelectric substrate, wherein each of the first and second filter elements has a ladder-type structure in which a plurality of resonators having comb-shaped electrode fingers is disposed on a series arm and one or a plurality of parallel arms, the first and second filter elements are placed on the piezoelectric substrate so as be made face to face with each other, all the plurality of resonators of the first and second filter elements are arranged so as to have the longitudinal direction thereof along a propagating direction of an elastic surface wave of the piezoelectric substrate, and at least one of the resonators placed on the series arm of the first filter element is disposed at a position that deviates from elastic wave propagating paths of the one or the plurality of resonators placed on the one or the plurality of parallel arms of the second filter element on the piezoelectric substrate.

In accordance with the fourth aspect, an elastic wave that leaks from at least one of the series resonators that are resonators used for controlling the characteristic of the first filter element on the high pass band side is restrained from being received by one or a plurality of parallel resonators used for controlling the characteristic of the second filter element on the low pass band side. Thus, it becomes possible to achieve a duplexer that is superior in isolation characteristic.

A duplexer in accordance with a fifth aspect is provided with a first filter element and a second filter element having a frequency pass band higher than that of the first filter element, which are placed on a piezoelectric substrate, wherein each of the first and second filter elements has a ladder-type structure in which a plurality of resonators having comb-shaped electrode fingers is disposed on a series arm and one or a plurality of parallel arms, the first and second filter elements are placed on the piezoelectric substrate so as be made face to face with each other, all the plurality of resonators of the first and second filter elements are arranged so as to have the longitudinal direction thereof along a propagating direction of an elastic surface wave of the piezoelectric substrate, and a resonator having the largest width of the elastic wave propagating path among the resonators placed on the series arm of the first filter element is disposed at a position that deviates from the elastic surface wave propagating paths of the one or the plurality of resonators placed on the one or the plurality of parallel arms of the second filter element on the piezoelectric substrate.

In accordance with the fifth aspect, an elastic wave that leaks from the resonator having the largest width in the elastic wave propagating path among the series resonators used for controlling the characteristic of the first filter element on the high pass band side is effectively restrained from being received by one or a plurality of parallel resonators used for controlling the characteristic of the second filter element on the low pass band side. Thus, it becomes possible to achieve a duplexer that is superior in isolation characteristic.

A duplexer in accordance with a sixth aspect, which relates to the duplexer of the fifth aspect, has a structure in which all the resonators disposed on the series arm of the first filter are disposed at positions that deviate from elastic wave propagating paths of the one or the plurality of resonators placed on the one or the plurality of parallel arms of the second filter element on the piezoelectric substrate.

In accordance with the sixth aspect, an elastic wave that leaks from the series resonators that are resonators used for controlling the characteristic of the first filter element on the high pass band side is restrained from being received by one or a plurality of parallel resonators used for controlling the characteristic of the second filter element on the low pass band side to a level that causes no problems in practical use. Thus, it becomes possible to achieve a duplexer that is superior in isolation characteristic.

A duplexer in accordance with a seventh aspect is provided with a first filter element and a second filter element having a frequency pass band higher than that of the first filter element, which are placed on a piezoelectric substrate, wherein each of the first and second filter elements has a ladder-type structure in which a plurality of resonators having a pair of comb-shaped electrode fingers is disposed on a series arm and one or a plurality of parallel arms, the first and second filter elements are placed on the piezoelectric substrate so as be made face to face with each other, all the plurality of resonators of the first and second filter elements are arranged so as to have the longitudinal direction thereof along a propagating direction of an elastic surface wave of the piezoelectric substrate, and the resonators disposed on the series arm of the first filter element and the resonators disposed on the one or the plurality of parallel arms of the second filter element are disposed at positions that mutually deviate from elastic wave propagating paths of the other on the piezoelectric substrate.

In accordance with the seventh aspect, an elastic wave that leaks from the series resonators that are resonators used for controlling the characteristic of the first filter element on the high pass band side is restrained from being received by one or a plurality of parallel resonators used for controlling the characteristic of the second filter element on the low pass band side to a level that causes no problems in practical use. Thus, it becomes possible to achieve a duplexer that is superior in isolation characteristic.

Moreover, in accordance with the first to seventh aspects, even when the parallel resonators of the first filter element and the series resonators of the second filter element are disposed so that an elastic wave leaking from one of these is received by the other, the occurrence of the corresponding receiving process gives only the small influence to the isolation characteristic; therefore, those resonators can be disposed without the necessity of having to take overlapped elastic wave propagating paths into consideration.

A duplexer in accordance with an eighth aspect, which relates to the duplexer of the first aspect, has a structure in which a resonator having the largest width of the elastic wave propagating path among the resonators placed on the series arm of the first filter element is disposed within an area sandwiched by respective elastic wave propagating paths of a resonator placed on the outermost side of parallel arms of the second filter element and a resonator disposed adjacent thereto on the corresponding parallel arms.

In accordance with the eighth aspect, it is possible to achieve a duplexer that has a small size with a superior isolation characteristic.

A duplexer in accordance with a ninth aspect, which relates to the duplexer of the first aspect, has a structure in which the piezoelectric substrate has a square shape or a rectangular shape, and the propagating direction of the elastic surface wave is in parallel with any one of the sides of the piezoelectric substrate.

In accordance with the ninth aspect, it is possible to achieve a duplexer that reduces the dead space on the piezoelectric substrate, and is superior in isolation characteristic.

A communication apparatus in accordance with a tenth aspect is constituted by using a duplexer according to the first aspect.

In accordance with the tenth aspect, it becomes possible to provide a communication apparatus formed by using a duplexer having a superior isolation characteristic, which has a small size and is superior in communication quality.

BEST MODE FOR CARRYING OUT THE INVENTION

<Structure of Duplexer>

Figure 1:
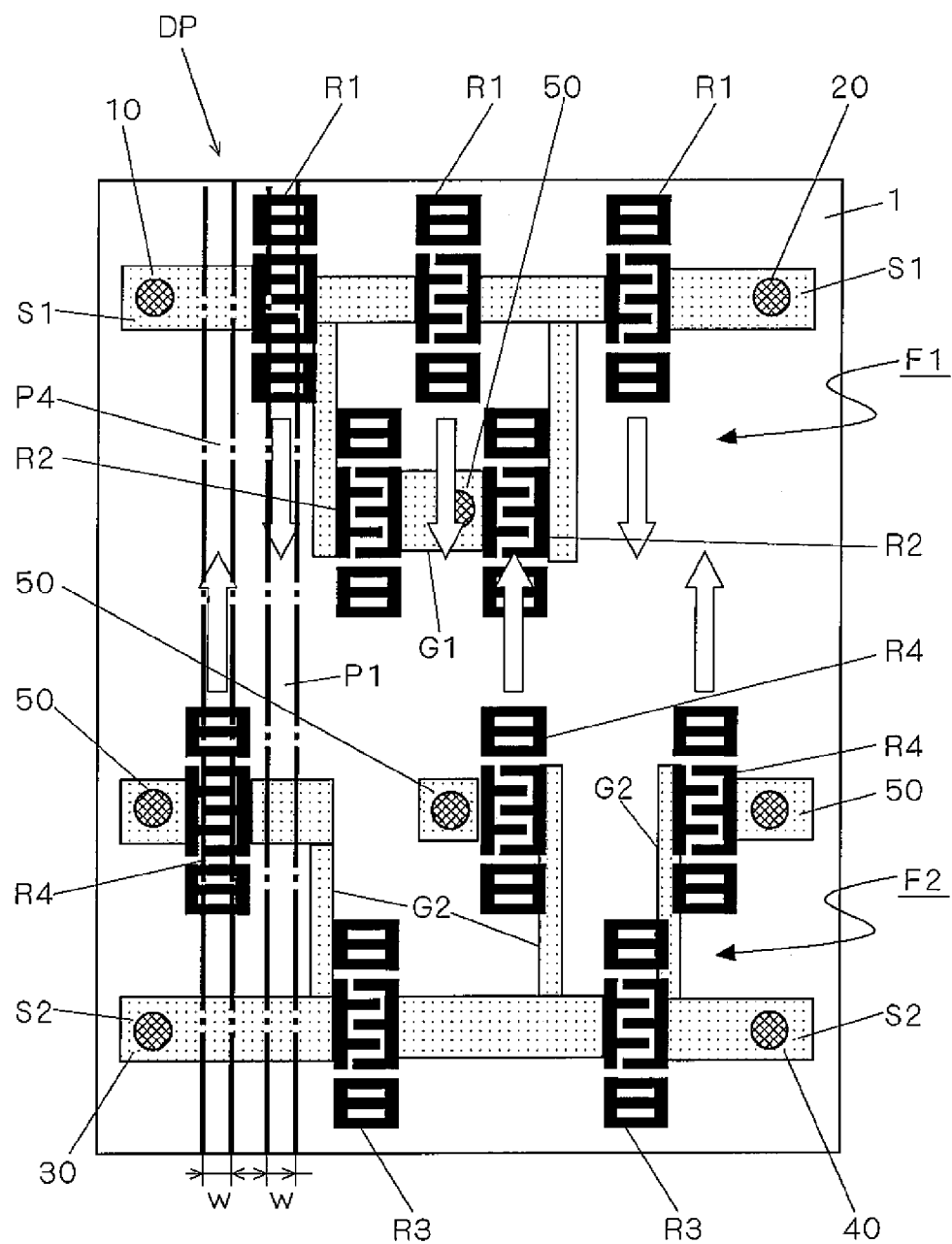
FIG. 1 is a top view that shows a duplexer DP in accordance with an embodiment of the present invention.
Figure 2:
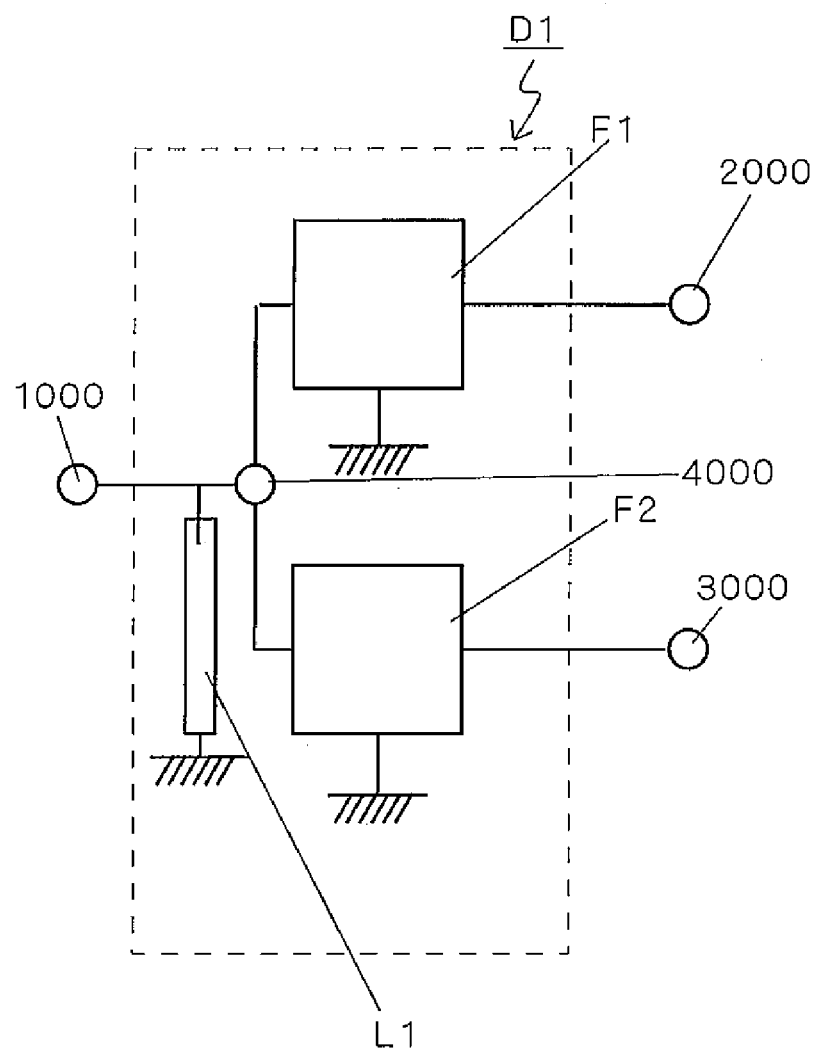
FIG. 2 is a circuit block diagram that shows a general duplexer.

Referring to Figures, the following description will discuss embodiments of a duplexer of the present invention. Here, in the Figures to be explained below, those components having the same functions are indicated by the same reference numeral. Moreover, the sizes of the respective electrodes, the distance or the like between electrodes, the number of electrode fingers, and the lengths and widths or the like between them are schematically shown in the Figures for convenience of explanation; therefore, the present invention is not intended to be limited by those illustrated in the Figures.

FIG. 1 is a top view showing a duplexer DP in accordance with the present embodiment. The duplexer DP is constituted by first and second filter elements F1 and F2. Both of the first and second filter elements F1 and F2 are prepared as ladder-type filters. Here, the first and second filter elements F1 and F2 are designed so that the second filter element F2 has a higher frequency pass band than that of the first filter element F1. That is, in the duplexer DP, the first filter element serves as a low pass band filter element and the second filter element serves as a high pass band filter element.

The first and second filter elements F1 and F2 are formed on the upper face (surface) of a piezoelectric substrate 1, and each of these is constituted by a plurality of resonators R1, R2, R3 and R4, signal lines S1 and S2 for connecting them, earth wires G1 and G2, input/output electrodes 10 and 20 on the transmission side, input/output electrodes 30 and 40 on the receiving side, as well as a earth electrode 50. Each of the resonators R1, R2, R3 and R4 is constituted by an IDT having comb-shaped electrode fingers and a reflector.

The first filter element F1 is provided with a plurality of resonators R1 (which are referred to also as series resonators R) that are disposed at positions electrically in series with one another and a plurality of resonators R2 (which are referred to also as parallel resonators R1) that are disposed at positions electrically in parallel with one another. More specifically, the series resonators R1 are disposed on a signal line S1 that connects the input/output electrodes 10 and 20 on the transmission side with each other. Moreover, the parallel resonators R2 are disposed on an earth wire G1 that connects the signal line S1 and the earth electrode 50 with each other.

In the same manner, the second filter element F2 is provided with a plurality of resonators R3 (which are referred to also as series resonators R3) that are disposed at positions electrically in series with one another and a plurality of resonators R4 (which are referred to also as parallel resonators R4) that are disposed at positions electrically in parallel with one another. More specifically, the series resonators R3 are disposed on a signal line S2 that connects the input/output electrodes 30 and 40 on the receiving side with each other. Moreover, the parallel resonators R4 are disposed on earth wires G2 that connect the signal line S2 and the earth electrodes 50 with each other.

In the duplexer DP in accordance with the present embodiment, all the resonators R1 to R4 are placed, with the longitudinal direction thereof being aligned in a propagating direction of elastic surface waves in the piezoelectric substrate 1. That is, all the resonators R1 to R4 are disposed so as to allow comb-shaped electrode fingers of the respective IDT and reflector to be directed to a direction perpendicular to the propagating direction. Here, with respect to each of the resonators, an area formed by extending the intersecting portion of the comb-shaped electrode fingers of the IDT to the propagating direction of the elastic surface wave is defined as an elastic wave propagating path of the resonator. In FIG. 1, for simplicity of illustration, only the elastic wave propagating paths P1 and P4 are shown with respect to one of the series resonators R1 and one of the parallel resonators R4. An area with a width w, sandwiched by two alternate long and short dash lines, corresponds to each of these. With respect to the other resonators, the elastic wave propagating paths are defined in the same manner.

Moreover, each arrow with a white void in FIG. 1 indicates a direction in which elastic waves leak from the series resonators R1 and the parallel resonators R4. The leakage of elastic waves occurs along the elastic wave propagating path of each of the resonators. In this case, however, the leakage waves are considered to propagate not only on the surface of the piezoelectric substrate 1, but also to the inside thereof. In the duplexer DP, the leakage of elastic waves may occur in the other resonators having no arrow with a white void in the Figure in the same manner. Moreover, the leakage of elastic waves also occurs not only in the direction indicated by the arrow with a white void, but also in an opposing direction thereto with the resonator interposed therebetween; however, the explanation thereof is omitted.

A piezoelectric substrate having a square shape or a rectangular shape on a surface (upper face) on which filter elements are formed is used as the piezoelectric substrate 1, and elastic wave propagating directions of all the resonators contained in the first and second filter elements F1 and F2 are preferably made in parallel with any one of the sides of the piezoelectric substrate 1. In this case, since an arrangement in which the resonators are disposed near the edge portions of the piezoelectric substrate 1 may be used, it is possible to achieve a duplexer that can reduce the dead space on the piezoelectric substrate 1. This structure contributes to a low cost of the production of a duplexer.

<Layout Relationship of Resonators>

As shown in FIG. 1, in the duplexer DP relating to the present embodiment, the series resonators R1 contained in the first filter element F1 and the parallel resonators R4 contained in the second filter element F2 are disposed so that the elastic wave propagating paths are not overlapped with each other. In other words, the series resonators R1 and the parallel resonators R4 are mutually disposed at positions out of the elastic wave propagating paths of the counterpart resonators. The layout relationship of the resonators is referred to also as "the first resonator layout requirement relating to the present embodiment".

By disposing the series resonators R1 and the parallel resonators R4 in a manner so as to satisfy the resonator layout relating to the present embodiment, it is possible to restrain elastic waves that leak from the series resonators R1 from being received by the parallel resonators R4. Thus, the duplexer DP of the present embodiment makes it possible to improve the mutual isolation characteristic between the first and second filter elements F1 and F2.

By satisfying the first resonator layout requirement relating to the present embodiment, the isolation characteristic can be improved, and the reason why the improvement is obtained is presumed as follows: in general, in the ladder-type filter, it is the series resonators that give stronger influences to the characteristic of a frequency pass band on the high band side, while it is the parallel resonators that give stronger influences to the characteristic of a frequency pass band on the low band side. Therefore, in the case of a duplexer having two kinds of ladder-type filters having different frequency pass bands, between the series resonators of the low pass band filter element (relating to the characteristic on the high band side of the pass band) and the parallel resonators of the high pass band filter element (relating to the characteristic on the low band side of the pass band), those resonators having the closest frequency bands mutually related are combined with each other. That is, the layouts of these resonators tend to give highest influences to the isolation characteristic; therefore, by disposing the series resonators R1 and the parallel resonators R4 as shown in the duplexer DP relating to the present embodiment, the elastic waves leaked from the former are restrained from being received by the latter so that it is presumed that the isolation characteristic can be improved.

Moreover, in the ladder-type filter, between the parallel resonators of the low pass band filter element (relating to the characteristic on the low band side of the pass band) and the series resonators of the high pass band filter element (relating to the characteristic on the high band side of the pass band), those resonators having the farthest frequency bands mutually related are combined with each other. Therefore, since the influences to be given to the isolation characteristic by the joined elastic waves leaked from these resonators becomes smaller in comparison with the above-mentioned arrangement, these resonators can be disposed closely without the necessity of taking into consideration of the overlapped propagating paths of the elastic waves. That is, it is only necessary to dispose the series resonators R1 of the first filter element F1 and the parallel resonators R4 of the second filter element as described above so as to satisfy the first requirement of resonator layout relating to the present embodiment; thus, this structure makes it possible to achieve a duplexer having a small size and being superior in isolation characteristic.

<Modified Example of Duplexer>

The above-mentioned explanation has been given on the assumption that the respective antenna terminals, not shown, of the first and second filter elements F1 and F2 are electrically separated from each other; however, the mode of the duplexer DP relating to the present embodiment is not limited to this, and even a structure having commonly connected antenna terminals can be applied without causing any problems. By selecting any one of the structures on demand, a designing process may be carried out in accordance with required characteristics.

Moreover, the number of electrode fingers of the IDT of the series resonators and parallel resonators R1, R2, R3 and R4 that constitute the first and second filter elements F1 and F2, the intersection width of the electrode fingers, the layout intervals of the electrode fingers and the like may be selected in accordance with the desired design. That is, these are not limited by those shown in FIG. 1.

Figure 4:
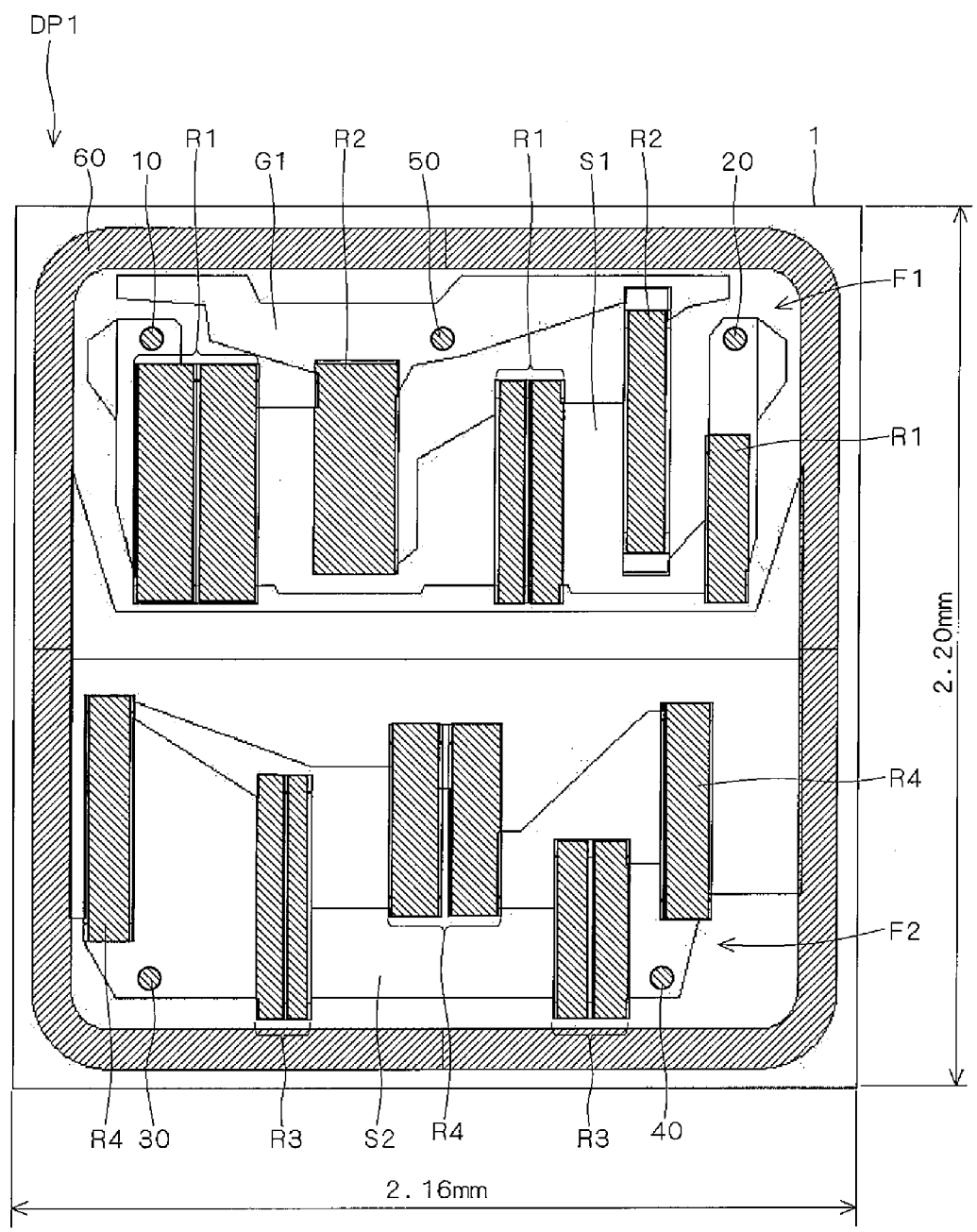
FIG. 4 is a drawing that shows a duplexer DP1 relating to a modified example.
Figure 5:
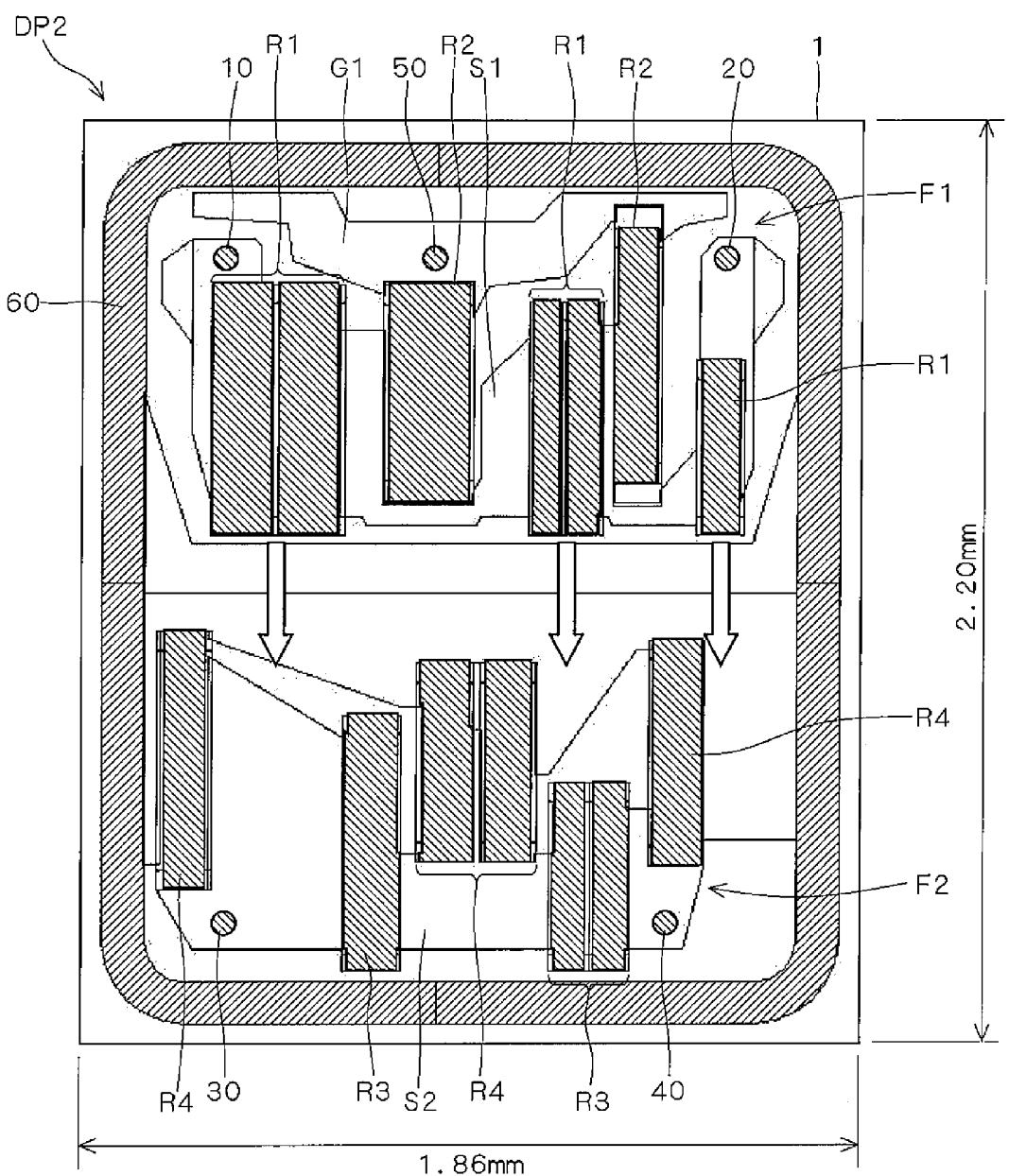
FIG. 5 is a drawing that shows a duplexer DP2 relating to another modified example.
Figure 6:
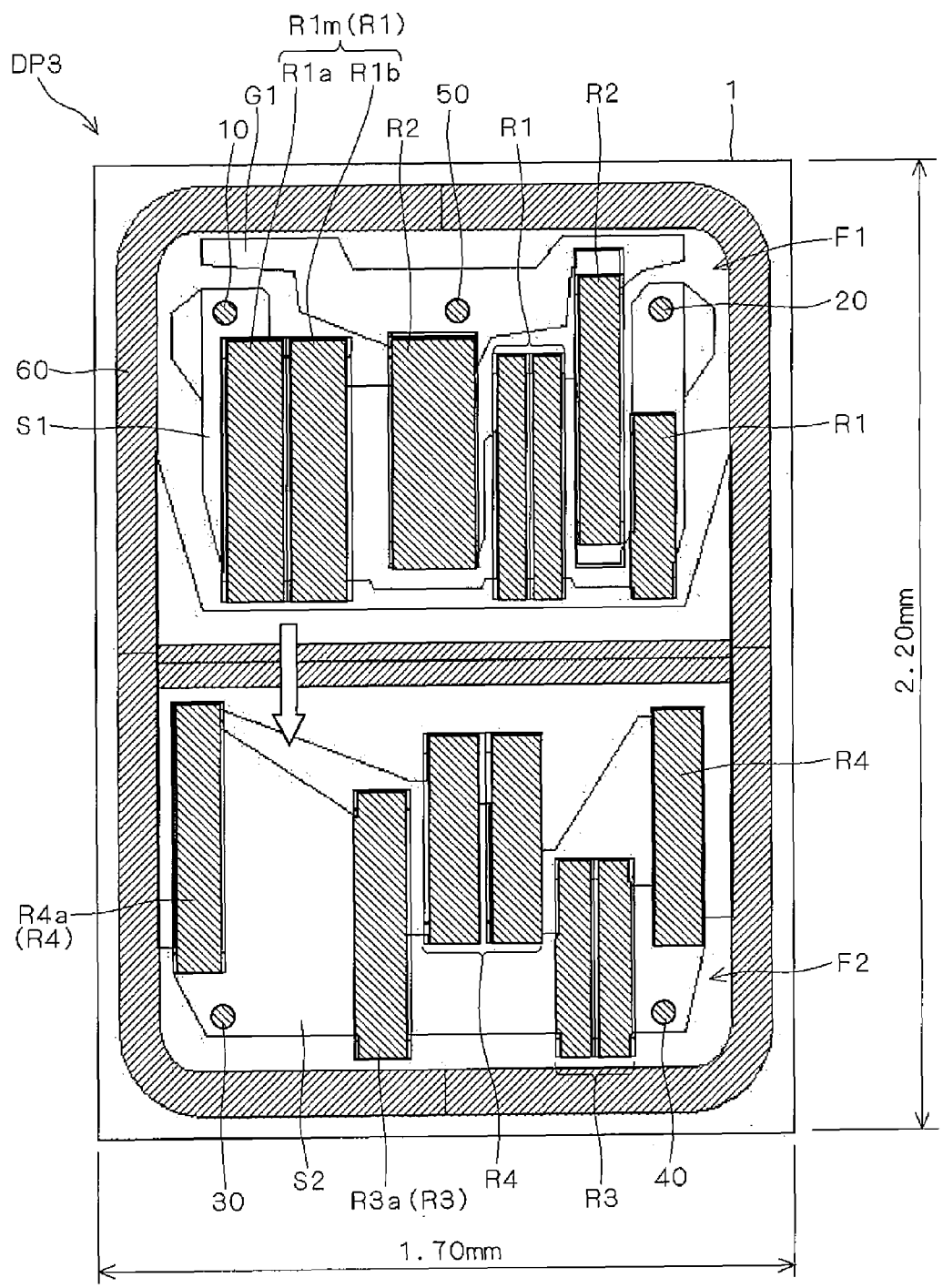
FIG. 6 is a drawing that shows a duplexer DP3 relating to the other modified example.

FIGS. 4, 5 and 6 are drawings that respectively show duplexers DP1, DP2 and DP3 having resonator layouts different from that of the duplexer DP. Here, in the respective Figures, for convenience of illustration, the IDTs and reflectors are integrally indicated by hatched portions. Here, each of the duplexers DP1, DP2 and DP3 is provided with an annular electrode 60 on the peripheral portion of the surface of the piezoelectric substrate 1. All the designing processes of the resonators R1, R2, R3 and R4 used for the duplexers DP1, DP2 and DP3 are the same, with only the layout of the respective resonators being altered. Moreover, in each of the duplexers, some of the resonators are divided into two so as to improve the voltage resistant property.

In the duplexer DP1 of FIG. 4, the elastic wave propagating paths of all the resonators of the first filter element F1, that is, all the series resonators R1 and all the parallel resonators R2, and the elastic wave propagating paths of all the resonators of the second filter element F2, that is, all the series resonators R3 and all the parallel resonators R4, are disposed at positions that deviate from one another.

In contrast, in the same manner as in FIG. 1, in the duplexer DP2 of FIG. 5, the elastic wave propagating paths of all the series resonators R1 of the first filter element F1 and the elastic wave propagating paths of all the parallel resonators R4 of the second filter element F2 are disposed at positions that deviate from one another, while the elastic wave propagating paths of the parallel resonators R2 of the first filter element F1 and the elastic wave propagating paths of the series resonators R3 of the second filter element F2 are disposed at positions so as to be overlapped with one another. Moreover, in the duplexer DP3 of FIG. 6, among the resonators of the first filter element F1, the elastic wave propagating paths of a series resonator R1$m$ having the largest width of the elastic wave propagating path (which is divided into a series resonator R1$a$ and a series resonator R1$b$ so as to improve the power resistant property in this case) and all the parallel resonators R4 of the second filter element F2 are disposed at positions that mutually deviate from one another, with the elastic wave propagating paths of the series resonators R1 other than the series resonator R1$m$ and the elastic wave propagating paths R4 of the parallel resonators R4 being disposed at positions so as to be overlapped with one another.

Figure 8:
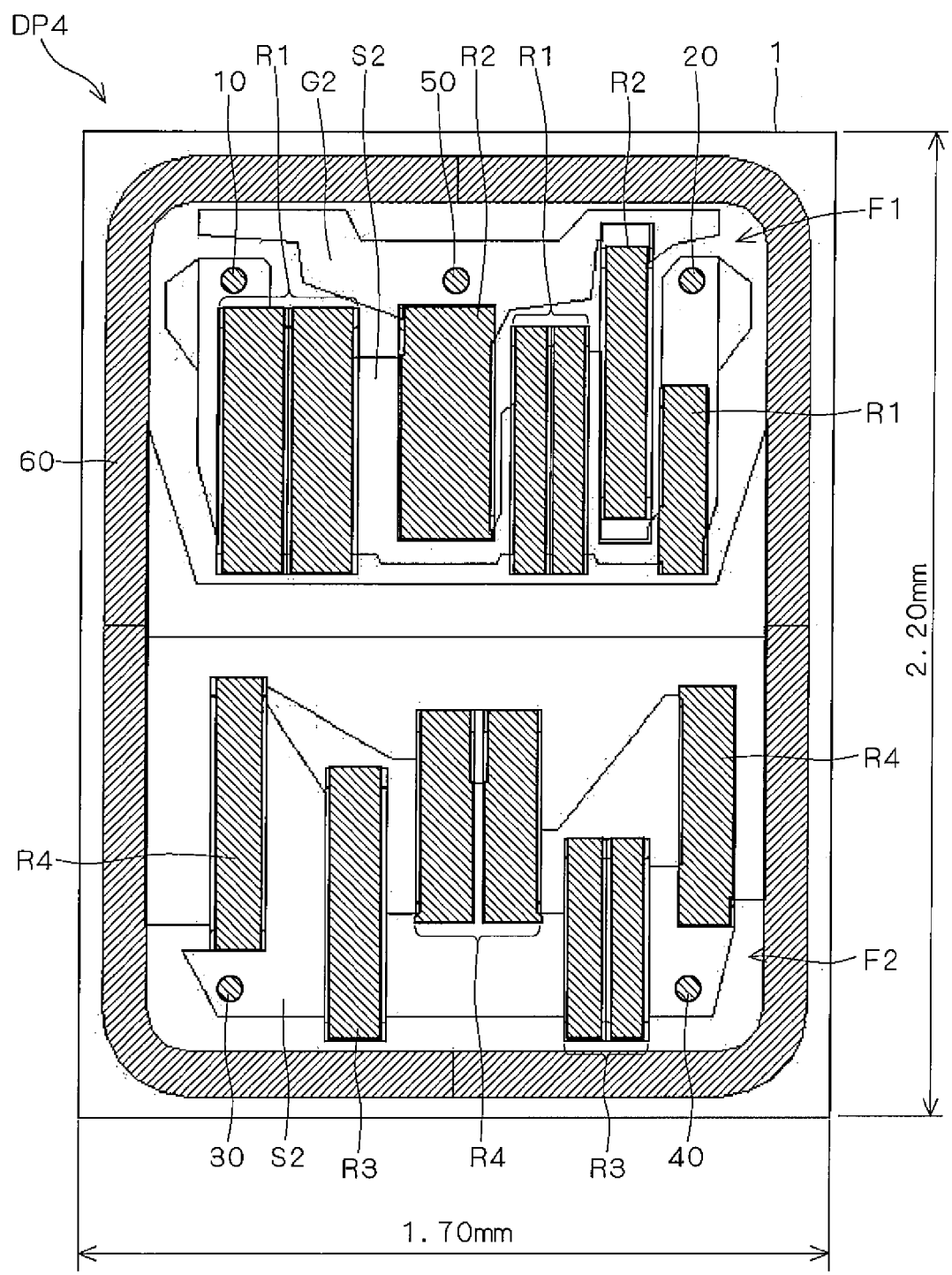
FIG. 8 is a drawing that shows a duplexer DP4 relating to the comparative example.

Moreover, FIG. 8 is a drawing that shows a duplexer DP4 in which resonators are disposed so as to make its size as small as possible, without taking it into consideration that the elastic wave propagating paths of the series resonators R1 of the first filter element F1 and the parallel resonators R4 of the second filter element F2 are be overlapped with each other. The resonators R1, R2, R3 and R4 possessed by the duplexer DP4 are designed so as to be the same as those resonators possessed by the duplexers DP1, DP2 and DP3.

The inventors of the present invention have confirmed that when the isolation characteristics of these duplexers DP1, DP2, DP3 and DP4 are compared with one another, the duplexer DP1 has the best isolation characteristic, and the duplexer DP2 and the duplexer DP3 have better characteristics in this order, and the duplexer DP4 has the worst characteristic. This means that by disposing at least one of the parallel resonators R4 of the second filter element F2 at a position that deviates from the elastic wave propagating path of the series resonators R1 of the first filter element F1, for example, as indicated by the duplexer DP3, the effect of improving the isolation characteristic can be obtained. In other words, this also means that, when at least one of the series resonators R1 of the first filter element F1 is disposed at a position that deviates from the elastic wave propagating path of the parallel resonators R4 of the second filter element F2, the effect of improving the isolation characteristic can be obtained. This layout relationship of the resonators is referred to also as "the second resonator layout requirement relating to the present embodiment".

The duplexer DP1 shown in FIG. 4 has a structure in which the elastic wave propagating paths of all the resonators are disposed at positions that deviate from one another; therefore, although a good isolation characteristic is prepared, it is insufficient from the viewpoint of miniaturization, in comparison with the duplexers DP2 and DP3. For example, supposing that the length in the longitudinal direction on the Figure (more strictly speaking, on the piezoelectric substrate 1) of each of the duplexers DP1 through DP4 illustrated, for example, in FIGS. 4 to 6 and FIG. 8 is 2.2 mm, the lengths in the lateral direction on the Figure of the respective duplexers DP1 to DP4 of FIG. 4 are 2.16 mm, 1.86 mm, 1.70 mm and 1.70 mm. Then, the surface areas of the piezoelectric substrates 1 are respectively 4.75 mm$^2$, 4.09 mm$^2$, 3.74 mm$^2$ and 3.74 mm$^2$. In this case, the surface area of each of the duplexer DP3 shown in FIG. 6 and the duplexer DP4 shown in FIG. 8 becomes smaller than that of the duplexer DP1 shown in FIG. 4 by about 22%. In contrast, in the structure of the duplexer DP4, since elastic waves, leaked from the series resonators of the first filter element F1, are received by the parallel resonators of the second filter element F2, it is not possible to obtain a superior isolation characteristic. In view of these points, by providing a structure that satisfies the layout requirement of the second resonators relating to the present embodiment, it becomes possible to provide a duplexer that achieves a small size, and also has a superior isolation characteristic.

In particular, the structure as shown by the duplexer DP3 of FIG. 6 in which the parallel resonators R4 of the second filter element F2 are disposed at positions that deviate from the elastic wave propagating path of the series resonator R1$m$ having the largest width of the elastic wave propagating path of the series resonators R1 of the first filter element F1 is desirably used since it becomes possible to more effectively obtain the effect of the miniaturization of the size and the effect for improving the isolation characteristic. That is, the corresponding structural mode makes it possible to satisfy the layout requirement of the second resonators that the present embodiment calls for, and also to minimize the surface area of the piezoelectric substrate 1. Here, the duplexer DP3 of FIG. 6 has a structure that is assumed to be installed in a communication apparatus with a mode in which the first filter element F1 is used for a circuit on the transmission side and the second filter element F2 is used for a circuit on the receiving side. That is, it is provided with a transmission-side input electrode 10, a receiving-side output electrode 20, a receiving-side output electrode 30 and a receiving-side input electrode 40. Moreover, the duplexer to be used in this mode is generally designed so that, among the series resonators on the transmission side, the width of the elastic wave propagating path of the one on the first stage is made greatest. The reason for this structure is explained below: in the duplexer, since a high power signal amplified by a power amplifier is inputted to the transmitting filter, it is effective to provide a series-connected series resonator on the first stage so as to satisfy the power resistant performance of the duplexer. The duplexer DP3 of FIG. 6 also has the corresponding structure, and by disposing the parallel resonators R4 of the second filter element F2 at positions that deviate from the elastic wave propagating path of the series resonator on the first stage, it becomes possible to more effectively obtain the effect for improving the isolation characteristic. From another viewpoint, among the series resonators R1 of the first filter element F1, by desirably disposing the resonator R1m having the largest width of the elastic wave propagating path at a position that deviates from the elastic wave propagating path of the parallel resonators R4 of the second filter element F2, it becomes possible to more effectively obtain the effect for improving the isolation characteristic. In particular, since the series resonator on the first stage of the transmission filter to which a high power signal is inputted has a higher intensity of an elastic wave to be leaked, the layout of FIG. 6 is very effective so as to restrain the leakage.

Here, the duplexer DP3 shown in FIG. 6 has a structure in which the series resonator R1m of the first filter element F1 is disposed within an area sandwiched by respective elastic wave propagating paths of a parallel resonator R4a placed on the outermost side of parallel arms of the second filter element F2 and a parallel resonator R4b adjacent thereto.

Moreover, the duplexer DP3 shown in FIG. 6 has a structure in which in addition to the peripheral portion of the surface of the piezoelectric substrate 1, an annular electrode 60 is also placed at a portion between the first filter element F1 and the second filter element F2. In the case when the annular electrode 60 is used as the earth electrode (reference potential electrode), since the electrode on the earth electrode side of the parallel resonator R4a can be shared with the annular electrode 60, further miniaturization is effectively achieved. In this manner, even when there is an annular electrode between the first and second filter elements F1 and F2, the effect of further improving the isolation characteristic can be obtained as long as the first and second requirements of the resonator layout of the present embodiment are satisfied. The reason for this is explained as follows: the leakage of elastic waves occurs also in the depth direction of the piezoelectric substrate 1, and these waves propagate over the bottom face of the piezoelectric substrate 1 as so-called bulk waves to result in that reflected waves from the bottom face propagate toward the surface; however, the above-mentioned layout of the resonators prevents the elastic waves, leaked from the series resonators R1 of the first filter element F1 and propagated in a manner so as to pass under the annular electrode 60, from being received by the parallel resonators of the second filter element.

<Method for Manufacturing Duplexer>

The following description will discuss materials for the respective components of the duplexer of the present embodiment and a method for manufacturing the duplexer. The following explanation will be given on the assumption that annular electrodes, shown in FIGS. 4 to 6, are installed.

With respect to the piezoelectric substrate 1, a material, such as $LiTaO_3$ single crystal of $36°±10°$ Y-cut–X-propagation, $LiNbO_3$ single crystal of $64°±10°$ Y-cut–X propagation and $Li_2B_4O_7$ single crystal of 45®±10° X-cut–Z-propagation, is preferably used. The reason for this is because these materials have a high electromechanical coupling coefficient and a small group delay time temperature coefficient. In particular, $LiTaO_3$ single crystal of $36°±10°$ Y-cut–X-propagation, which has a high electromechanical coupling coefficient, is desirably used. Moreover, the cut angle in the Y-axis crystal direction is preferably set in a range from $36°±10°$. Thus, it becomes possible to obtain a sufficient piezoelectric characteristic.

The thickness of the piezoelectric substrate 1 may be set in a range from 0.1 to 0.5 mm. The thickness of less than 0.1 mm undesirably makes the piezoelectric substrate 1 bristle, and the thickness exceeding 0.5 mm undesirably makes the material cost higher. Moreover, in order to prevent damages to electrodes due to pyroelectric effect, a piezoelectric substrate 1 that has been subjected to a reduction treatment may be used. Moreover, in order to prevent damages to electrodes due to pyroelectric effect, a piezoelectric substrate 1 to which a Fe element is added may be used.

Each of IDTs of the series resonators and the parallel resonators R1 to R4 is formed by engaging a pair of comb-shaped electrode fingers with each other. With respect to the material for the electrode fingers, Al or Al alloy, such as Al—Cu-based alloy, Al—Ti-based alloy, Al—Mg-based alloy and an Al—Cu—Mg-based alloy, may be used. Alternatively, an IDT may be constituted by laminated films of Al—Cu/Cu/Al—Cu, Ti/Al—Cu, Ti/Al—Cu/Ti or the like. Here, the reflector of each resonator may be formed by using the same material.

Moreover, the resonator is formed by processes in which a metal film, made of the above-mentioned material, is formed by using a thin-film forming method such as a vapor deposition method, a sputtering method or a CVD method, and this is then etched into a predetermined shape by using a conventionally known method such as photolithography and RIE. The IDTs and reflectors of each resonator are desirably formed, with the number of pairs of the comb-shaped electrode fingers in a range from 50 to 300, the line width of electrode fingers in a range from about 0.1 to about 10 µm, the pitches of the electrode fingers in a range of about 0.1 to about 10 µm, the opening width (intersection width) of the electrode fingers in a range of about 10 to about 200 µm and the thickness of each of the electrode fingers in a range of about 0.1 to about 0.5 µm, so as to obtain desired characteristics of the resonator.

Here, the signal lines, earth lines, pad electrodes, annular electrodes and the like may also be formed by using the same method as that of the above-mentioned resonators. Here, the signal lines refer not only to the transmission-side input/output electrodes 10 and 20 and receiving-side input/output electrodes 30 and 40 but also to wiring electrodes of signal potential, which connect the resonators with each other. Moreover, the earth lines refer not only to the earth electrodes 50 but also to wiring electrodes of earth potential (reference potential) ranging from the parallel resonators to the earth electrodes 50.

Moreover, with respect to the duplexer DP, a matching circuit, not shown, may be formed on its piezoelectric substrate 1, for example, as a conductor layer connected to the signal lines S1 and the like. In this case, by adjusting the width and the line passage length as well as the thickness and the like of the conductor layer, it is possible to realize a matching circuit having a desired inductance value. Alternatively, the matching circuit may be prepared by connecting a matching circuit as an external circuit or by installing an inductor element. Here, a matching circuit is incorporated into an assembling circuit substrate, for example, a LTCC (Low Temperature Co-fired Ceramics) substrate, and by assembling a piezoelectric substrate 1 with a duplexer DP formed thereon to the circuit substrate, the matching circuit and the duplexer DP may be connected with each other. At this time, solder bumps are formed at the portion of the aforementioned pad electrodes, and by also providing an electrode pattern having the corresponding shape on the counterpart circuit substrate, a fillip chip connection may be made with each other.

On each of the resonators, signal lines, earth lines, pad electrodes, annular electrodes and the like, a protective film made from, for example, $SiO_2$ is desirably formed. The protective layer can be formed by processes in which, after a $SiO_2$ film or the like has been formed thereon by a conventionally known CVD method, a sputtering method or the like, the resulting film is processed into a predetermined shape by photolithography, RIE or the like. Here, the thickness of the protective layer is set to, for example, about 0.02 μm.

<Application to Communication Apparatus>

As described above, the duplexer in accordance with the present embodiment has a small size and is superior in isolation characteristic. Therefore, the duplexer of the present embodiment is suitably applied to a communication apparatus.

Figure 7:
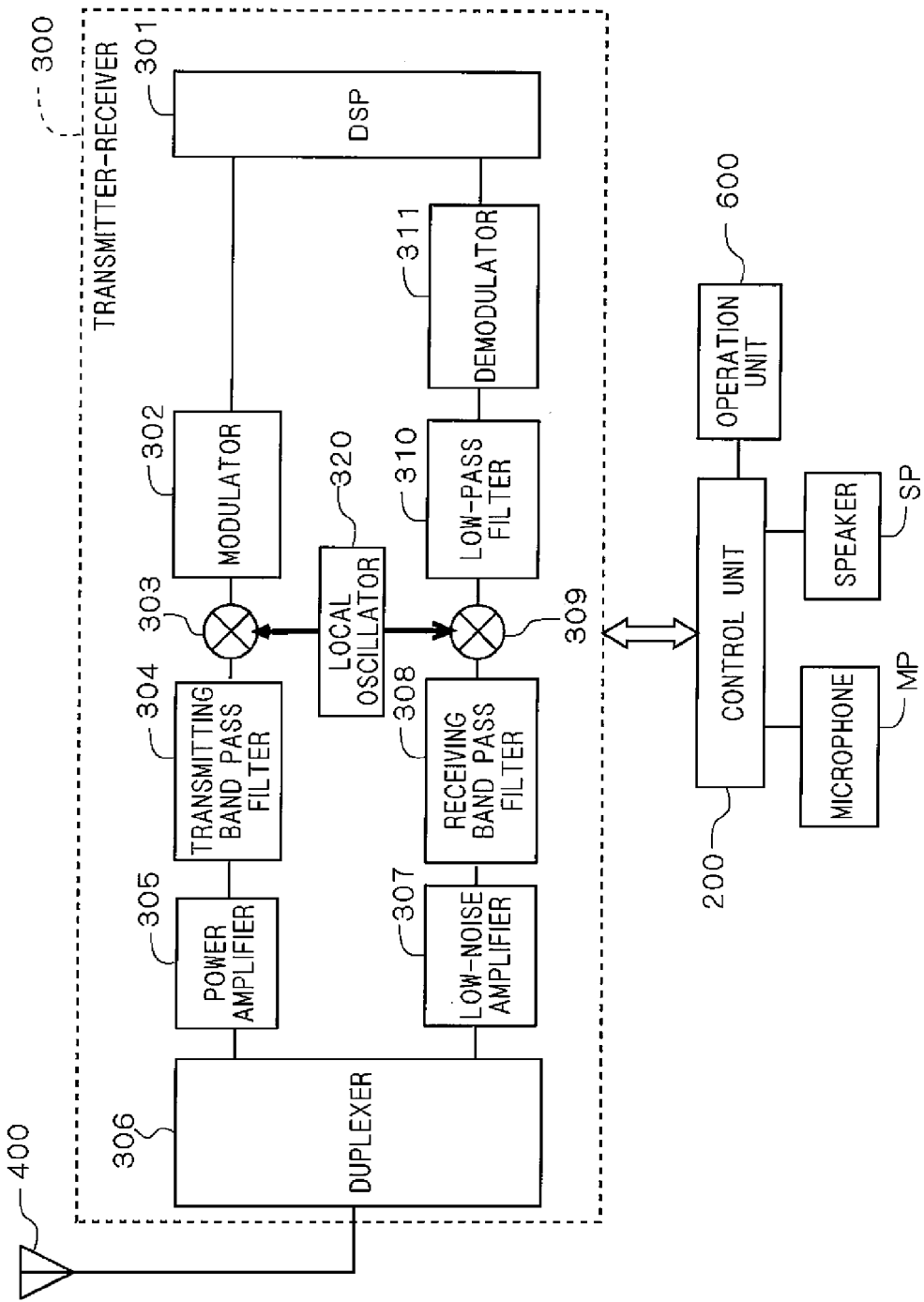
FIG. 7 is a drawing that schematically shows a structure of a communication apparatus 100.

FIG. 7 is a drawing that schematically shows a structure of a communication apparatus 100 as one example of the corresponding communication apparatus. The communication apparatus 100 is mainly provided with a transmitter-receiver 300, an antenna 400, a control unit 200, an operation unit 600, a microphone MP and a speaker SP.

The control unit 200 is a unit for systematically controlling various operations of the communication apparatus 100. The control unit 200 has a CPU, a RAM, a ROM and the like, and by reading programs stored in the ROM and executing the programs, the CPU carries out various controls and various functions on the communication apparatus 100.

In this transmitter-receiver 300, after an analog voice signal, inputted from the microphone MP through the control unit 200, has been A/D-converted (converted from the analog signal to the digital signal) in a DSP (Digital Signal Processor) 301, the resulting signal is modulated by a modulator 302, and further frequency-converted in a mixer 303 by using an oscillating signal of a local oscillator 320. The output of the mixer 303 is sent through a transmitting band pass filter 304 and a power amplifier 305, by way of a duplexer 306, to the antenna 400 as a transmission signal.

Moreover, the received signal from the antenna 400 is inputted to a mixer 309 through a low-noise amplifier 307 and a receiving band-pass amplifier 308 by way of the duplexer 306. The mixer 309 converts the frequency of the received signal by using an oscillating signal of the local oscillator 320, and the signal thus converted is demodulated by a demodulator 311 through a low-pass filter 310, and after having been further D/A converted (converted from a digital signal to an analog signal) in a DSP301, the resulting signal is outputted as an analog voice signal to the speaker SP.

The operation unit 600, which is a unit for receiving various inputs to the communication apparatus 100 by the user, is constituted by, for example, various buttons.

With respect to the duplexer 306 of the communication apparatus 100, the duplexer DP, or any one of DP1 to DP3, in accordance with the present embodiment, may be used. For example, when the first filter element F1 is used for a circuit on the transmitting side, while the second filter element is used for a circuit on the receiving side, it is possible to restrain leakage of a signal between the mutual circuits, and consequently to obtain higher communication quality. Thus, it becomes possible to provide a communication apparatus that has a small size and is superior in communication quality. Here, the second filter element may be used for the circuit on the transmitting side, with the first filter element being used for the circuit on the receiving side.

Here, the embodiment of the duplexer of the present invention is not intended to be limited by the above-mentioned mode, and various modifications may be made therein without departing the spirit and scope of the present invention.

For example, the number of pairs, the intersection width and the like of the comb-shaped electrode fingers may be made different in the mode for each of the resonators. Since the parasitic capacitance can be adjusted and the elastic surface wave can be controlled by properly determining the number of pairs, the intersection width and the like of the comb-shaped electrode fingers, it becomes possible to obtain a high-isolation characteristic with a lower loss.

EXAMPLES

The following description will discuss examples of a duplexer in accordance with the above-mentioned embodiment. Here, the following examples are only examples of the embodiment of the present invention, and the present invention is not intended to be limited by these. Here, in the present examples, the duplexer DP is designed to have a transmission frequency band in a range from 824 to 849 MHz and a receiving frequency band in a range from 869 to 894 MHz so that the first filter element F1 is used as the transmission circuit and the second filter element F2 is used as the receiving circuit.

First, a piezoelectric substrate made from $LiTaO_3$ was prepared, and a Ti thin-film layer having a thickness of 6 nm was formed on the main surface thereof, and an Al—Cu thin-film layer having a thickness of 130 nm was formed thereon. The total three layers of these respective layers were alternately laminated so that a Ti/A-Cu laminated film made of the total six thin-film layers was formed.

Next, photoresist was applied onto the Ti/Al—Cu laminated film with a thickness of about 0.5 μm by using a resist coating device. Moreover, a photoresist pattern to define resonators, signal lines, earth lines, pad electrodes and the like was formed thereon so as to provide layout positions thereof as shown in FIG. 6 by a reduction projection exposing machine (stepper). Thereafter, the photoresist on unnecessary portions was dissolved in an alkali developing solution by a developing device.

Next, an etching process was carried out by a RIE (Reactive Ion Etching) device so as to remove unnecessary portions, with the necessary portions being left, so that an electrode pattern as shown in FIG. 6 was formed.

More strictly speaking, the formation of the electrode pattern was carried out by repeatedly disposing desired electrode patterns two-dimensionally on the piezoelectric substrate prepared as a mother substrate for use in taking multiple pieces.

Next, a protective film was formed on a predetermined area of the electrode pattern. That is, a $SiO_2$ film was formed on main surfaces of the electrode pattern and the piezoelectric substrate with a thickness of 0.02 μm by a CVD (Chemical Vapor Deposition) device. Then, the photoresist was patterned by photolithography so that the $SiO_2$ film corresponding to electrode portions for flip-chips (pad electrode portions, such as input/output electrodes and earth electrodes, as well as portions of annular electrodes) was etched by a RIE device or the like.

Next, laminated electrodes, made from Cr, Ni and Au, were film-formed on portions corresponding to the removed $SiO_2$ film by a sputtering device. At this time, the film thickness of the electrodes was set to about 1 μm (Cr: 0.02 μm, Ni: 1 μm, Au: 0.1 μm). Then, the photoresist and the laminated electrodes at unnecessary portions were simultaneously removed by a lift-off method so that the portions on which the laminated electrodes had been formed were used as electrode portions for flip-chips, which were used for connecting bumps for flip-chips.

Thereafter, a dicing process was carried out along each of dicing lines placed on the piezoelectric substrate so that a number of chips, with electrode patterns being formed on an elongated piezoelectric substrate 1, were obtained.

Next, a conductor material is printed on pattern electrodes made from silver, input/output conductors, earth conductors and annular conductors, formed on the circuit substrate made from a ceramic material, which had been preliminarily prepared. Solder was used as the conductor material. Then, the respective chips were temporarily bonded onto the ceramic circuit substrate by a flip-chip assembling device, with the electrode formation surface facing down. The temporarily bonding process was carried out in a $N_2$ atmosphere. Moreover, a baking process was carried out in the $N_2$ atmosphere, and the solder was consequently fused so that the chips were bonded to the ceramic circuit substrate. The solder was fused on the annular electrodes formed on the chips, as well as on the annular conductors formed on the circuit substrate, to be bonded thereto so that the electrode pattern on the chip surface was sealed in an air-tight manner.

Moreover, the ceramic circuit substrate to which the chips had been bonded was coated with a resin, and baked in a $N_2$ atmosphere so that the chips were resin-sealed.

Lastly, dicing processes were carried out along dicing lines on the ceramic circuit substrate and the substrate was divided into individual pieces; thus, each duplexer A in accordance with the present example, assembled on the circuit substrate, was obtained. Here, each ceramic circuit substrate, divided into an individual piece, had a plane size of 2.5×2.0 mm and a laminated structure.

Moreover, as a comparative example, a duplexer B, which had a different layout of the resonators although it had the same film structure as that of the example, was manufactured by the same method. As shown in FIG. 8, in the duplexer B, the series resonators of the first filter element and the parallel resonators of the second filter element were disposed on such positions that the elastic wave propagating paths were overlapped with each other.

Figure 3:
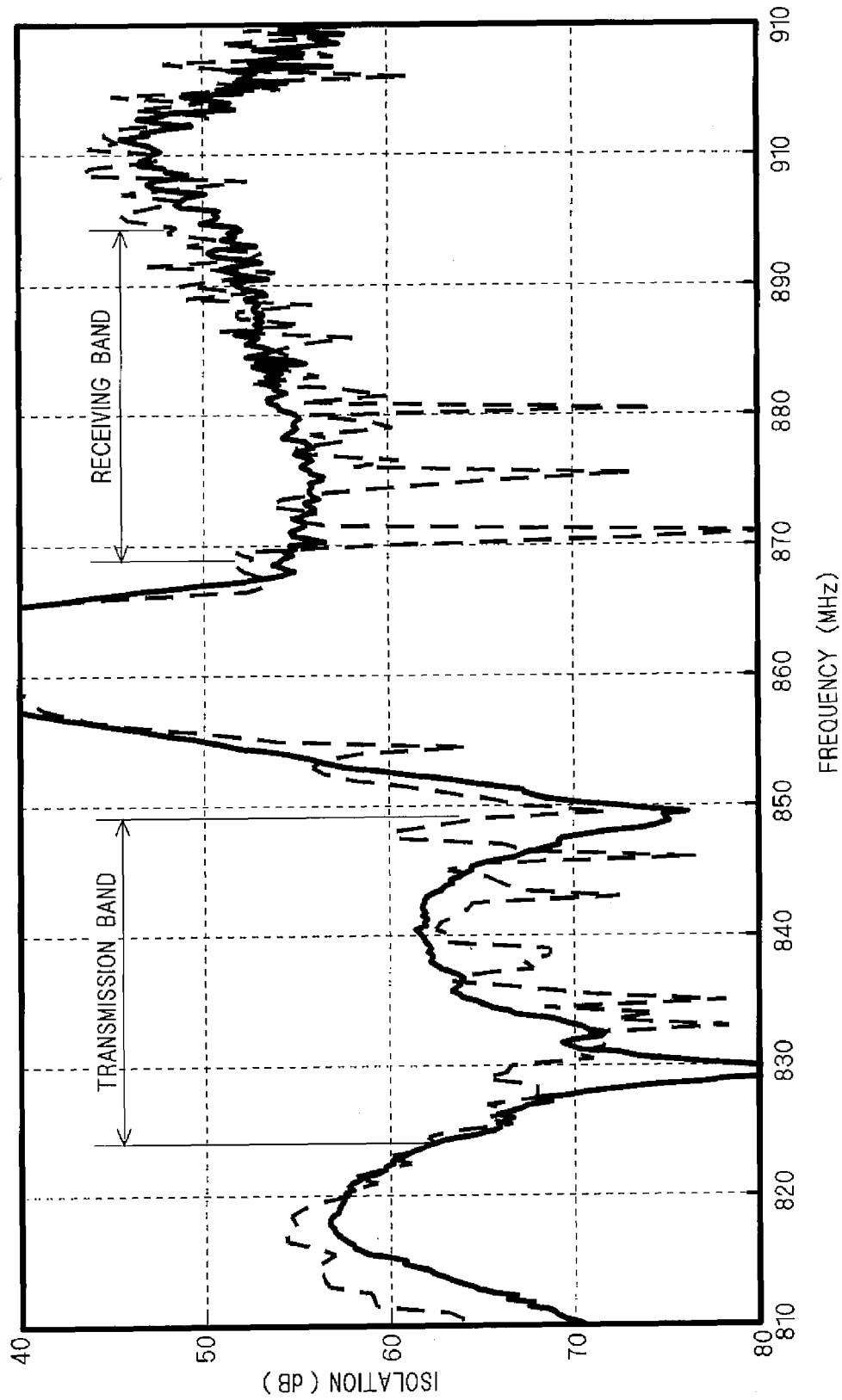
FIG. 3 is a line drawing that shows isolation characteristics of a duplexer relating to an example and a duplexer relating to a comparative example.

The electrical characteristics of these duplexers A and B were measured by a network analyzer. FIG. 3, which shows the results, is a line drawing that indicates isolation characteristics near the pass bands of the duplexers A and B. In FIG. 3, the axis of abscesses represents the frequency (unit: MHz), and the axis of ordinates represents isolation (unit: dB). The characteristic curve indicated by a solid line shows the results of the duplexer A, and the characteristic curve indicated by a broken line shows the results of the duplexer B.

As shown in FIG. 3, the duplexer A relating to the example had the results that an isolation characteristic was set to 62 dB in the transmission band, an isolation characteristic was set to 51 dB in the receiving band, and a ripple, caused by allowing an elastic wave leaked from a resonator to be received by another resonator, became extremely small. In contrast, the duplexer B relating to the comparative example had the results that an isolation characteristic was set to 60 dB in the transmission band and an isolation characteristic was set to 47 dB in the receiving band, thereby causing a large ripple.

Consequently, by disposing the series resonators R1 contained in the first filter element F1 and the parallel resonators R4 contained in the second filter element F2 in a manner so as not to have their mutual elastic wave propagating paths overlapped with, that is, so as to have the mutual elastic wave propagating paths disposed at positions mutually deviated from the other; thus, it becomes possible to restrain an elastic wave leaked from the former from receiving by the latter, and consequently to improve the isolation characteristic, thereby making it possible to confirm that a superior electrical characteristic can be achieved.

The invention claimed is:

1. A duplexer comprising:
a first filter element, being placed on a piezoelectric substrate, having a ladder-type structure in which a plurality of resonators having a pair of comb-shaped electrode fingers is disposed on a series arm and one or a plurality of parallel arms, wherein said plurality of resonators of said first filter element is arranged so as to have a longitudinal direction thereof along a propagating direction of an elastic surface wave of said piezoelectric substrate; and
a second filter element having a frequency pass band higher than that of said first filter element, being placed on said piezoelectric substrate so as to be made face to face with said first filter element, having a ladder-type structure in which a plurality of resonators having a pair of comb-shaped electrode fingers is disposed on a series arm and one or a plurality of parallel arms, wherein said plurality of resonators of said second filter element is arranged so as to have the a longitudinal direction thereof along a propagating direction of an elastic surface wave of said piezoelectric substrate, and one or the plurality of resonators placed on said one or the plurality of parallel arms of said second filter element is disposed at a position that deviates from an elastic wave propagating path of the resonator having the largest width in the elastic wave propagating path among resonators placed on said series arm of said first filter element on said piezoelectric substrate.

2. The duplexer according to claim 1, wherein one or the plurality of resonators placed on said one or the plurality of parallel arms of said second filter element is disposed at a position that deviates from elastic wave propagating paths of all resonators placed on the series arm of said first filter element on said piezoelectric substrate.

3. A duplexer comprising:
a first filter element, being placed on a piezoelectric substrate, having a ladder-type structure in which a plurality of resonators having a pair of comb-shaped electrode fingers is disposed on a series arm and one or a plurality of parallel arms, wherein said plurality of resonators of said first filter element is arranged so as to have a longitudinal direction thereof along a propagating direction of an elastic surface wave of said piezoelectric substrate; and
a second filter element having a frequency pass band higher than that of said first filter element, being placed on said piezoelectric substrate so as to be made face to face with said first filter element, having a ladder-type structure in which a plurality of resonators having a pair of comb-shaped electrode fingers is disposed on a series arm and one or a plurality of parallel arms, wherein said plurality of resonators of said second filter element is arranged so as to have a longitudinal direction thereof along a propagating direction of an elastic surface wave of said piezoelectric substrate, and a resonator having the largest width of the elastic wave propagating path among resonators placed on said series arm of the first filter element is disposed at a position that deviates from the elastic surface wave propagating paths of one or the plurality of resonators placed on said one or the plurality of parallel arms of said second filter element.

4. The duplexer according to claim 3, wherein all the resonators disposed on the series arm of said first filter are disposed at positions that deviate from elastic wave propagating paths of one or the plurality of resonators placed on said one or the plurality of parallel arms of said second filter element.

5. A duplexer comprising:

a first filter element, being placed on a piezoelectric substrate, having a ladder-type structure in which a plurality of resonators having a pair of comb-shaped electrode fingers is disposed on a series arm and one or a plurality of parallel arms, wherein said plurality of resonators of said first filter element is arranged so as to have a longitudinal direction thereof along a propagating direction of an elastic surface wave of said piezoelectric substrate; and a second filter element having a frequency pass band higher than that of said first filter element, being placed on said piezoelectric substrate so as to be made face to face with said first filter element, having a ladder-type structure in which a plurality of resonators having a pair of comb-shaped electrode fingers is disposed on a series arm and one or a plurality of parallel arms, wherein said plurality of resonators of said second filter element is arranged so as to have a longitudinal direction thereof along a propagating direction of an elastic surface wave of said piezoelectric substrate, and at least one of one or the plurality of resonators placed on said one or the plurality of parallel arms of said second filter element is disposed at a position that deviates from elastic wave propagating paths of all the resonators placed on said series arm of said first filter element on said piezoelectric substrate, wherein a resonator having the largest width of the elastic wave propagating path among resonators placed on said series arm of said first filter element is disposed within an area sandwiched by respective elastic wave propagating paths of a resonator placed on the outermost side of the plurality of parallel arms of said second filter element and a resonator disposed adjacent thereto on the a corresponding parallel arm of said plurality of parallel arms.

6. A communication apparatus constituted by using a duplexer said duplexer comprising:

a first filter element, being placed on a piezoelectric substrate, having a ladder-type structure in which a. plurality of resonators having a pair of comb-shaped electrode fingers is disposed on a series arm and one or a plurality of parallel arms, wherein said plurality of resonators of said first filter element is arranged so as to have the longitudinal direction thereof along a propagating direction of an elastic surface wave of said piezoelectric substrate; and a second filter element having a frequency pass band higher than that of said first filter element, being placed on said piezoelectric substrate so as to be made face to face with said first filter element, having a ladder-type structure in which a plurality of resonators having a pair of comb-shaped electrode fingers is disposed on a series arm and one or a plurality of parallel arms, wherein said plurality of resonators of said second filter element is arranged so as to have a longitudinal direction thereof along a propagating direction of an elastic surface wave of said piezoelectric substrate, and at least one of one or the plurality of resonators placed on said one or the plurality of parallel arms of said second filter element is disposed at a position that deviates from elastic wave propagating paths of all the resonators placed on said series arm of said first filter element on said piezoelectric substrate, wherein a resonator having the largest width of the elastic wave propagating path among resonators placed on said series arm of said first filter element is disposed within an area sandwiched by respective elastic wave propagating paths of a resonator placed on the outermost side of the plurality of parallel arms of said second filter element and a resonator disposed adjacent thereto on a corresponding parallel arm of said plurality of parallel arms.

* * * * *